US009499901B2

(12) United States Patent
Cao et al.

(10) Patent No.: US 9,499,901 B2
(45) Date of Patent: *Nov. 22, 2016

(54) HIGH DENSITY TIN RF/DC PVD DEPOSITION WITH STRESS TUNING

(71) Applicant: APPLIED MATERIALS, INC., Santa Clara, CA (US)

(72) Inventors: Yong Cao, San Jose, CA (US); Xianmin Tang, San Jose, CA (US); Adolph Miller Allen, Oakland, CA (US); Tza-Jing Gung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 279 days.

This patent is subject to a terminal disclaimer.

(21) Appl. No.: 13/750,318

(22) Filed: Jan. 25, 2013

(65) Prior Publication Data
US 2013/0199925 A1 Aug. 8, 2013

Related U.S. Application Data

(60) Provisional application No. 61/591,588, filed on Jan. 27, 2012.

(51) Int. Cl.
C23C 14/34 (2006.01)
C23C 14/35 (2006.01)
C23C 14/54 (2006.01)
H01J 37/34 (2006.01)

(52) U.S. Cl.
CPC ........... C23C 14/345 (2013.01); C23C 14/351 (2013.01); C23C 14/54 (2013.01); H01J 37/34 (2013.01)

(58) Field of Classification Search
CPC ................ C23C 14/345; C23C 14/351; C23C 14/54; H01J 37/34
USPC .......................... 204/192.12, 192.15, 192.17
See application file for complete search history.

(56) References Cited

U.S. PATENT DOCUMENTS 5,484,746 A * 1/1996 Ichikawa et al. ................. 117/8
5,540,820 A * 7/1996 Terakado et al. ........... 204/192.3
5,976,334 A * 11/1999 Fu et al. ................... 204/298.19
6,077,403 A * 6/2000 Kobayashi et al. ..... 204/192.12
(Continued)

FOREIGN PATENT DOCUMENTS

EP          1548146 A1 * 12/2004
WO    WO2010115128 A2 * 10/2010

OTHER PUBLICATIONS

U.S. Appl. No. 13/749,791, filed Jan. 25, 2013, Ge et al.

Primary Examiner — Rodney McDonald
(74) Attorney, Agent, or Firm — Moser Taboada; Alan Taboada

(57) ABSTRACT

Methods for depositing a layer on a substrate are provided herein. In some embodiments, a method of depositing a metal-containing layer on a substrate in a physical vapor deposition (PVD) chamber may include applying RF power at a VHF frequency to a target comprising a metal disposed in the PVD chamber above the substrate to form a plasma from a plasma-forming gas; optionally applying DC power to the target; sputtering metal atoms from the target using the plasma while maintaining a first pressure in the PVD chamber sufficient to ionize a predominant portion of the sputtered metal atoms; and controlling the potential on the substrate to be the same polarity as the ionized metal atoms to deposit a metal-containing layer on the substrate.

10 Claims, 3 Drawing Sheets

(56) References Cited

U.S. PATENT DOCUMENTS

| | | | |
|---|---|---|---|
| 7,922,880 B1 * | 4/2011 | Pradhan et al. | 204/298.06 |
| 2009/0314636 A1 * | 12/2009 | Ishikawa | C23C 14/35 204/298.16 |
| 2013/0008778 A1 | 1/2013 | Hoffman et al. | |

* cited by examiner

HIGH DENSITY TIN RF/DC PVD DEPOSITION WITH STRESS TUNING

CROSS-REFERENCE TO RELATED APPLICATIONS

This application claims benefit of U.S. provisional patent Application Ser. No. 61/591,588, filed Jan. 27, 2012, which is herein incorporated by reference.

FIELD

Embodiments of the present invention generally relate to methods of depositing metal-containing layers on substrates using radio frequency (RF)/direct current (DC) physical vapor deposition.

BACKGROUND

With shrinking line-width and spacing, it has become increasingly challenging to minimize RC delays and crosstalk in interconnects, thereby requiring the use of ultra low k (ULK) dielectric materials (i.e., k2.5). This can introduce porous low k materials in copper interconnects, which is more susceptible to strip damage. An exemplary hardmask layer, such as titanium nitride (TiN) can provide high etch selectivity to low-k dielectrics and photoresist materials, works as anti-reflective film, and reduces ULK damage caused by photoresist ash strip processes. Unfortunately, the inventors have observed that existing hardmask layers, such as TiN hardmask layers, can have high compressive stress (1.6 GPa) that may result in line bending during ULK patterning.

Thus, the inventors have provided improved methods for depositing metal-containing layers that may be useful as hardmask layers using RF/DC PVD processes.

SUMMARY

Methods for depositing a layer on a substrate are provided herein. In some embodiments, a method of depositing a metal-containing layer on a substrate in a physical vapor deposition (PVD) chamber includes applying RF power at a VHF frequency to a target comprising a metal disposed in the PVD chamber above the substrate to form a plasma from a plasma-forming gas; optionally applying DC power to the target; sputtering metal atoms from the target using the plasma while maintaining a first pressure in the PVD chamber sufficient to ionize a predominant portion of the sputtered metal atoms; and controlling the potential on the substrate to be the same polarity as the ionized metal atoms to deposit a metal-containing layer on the substrate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
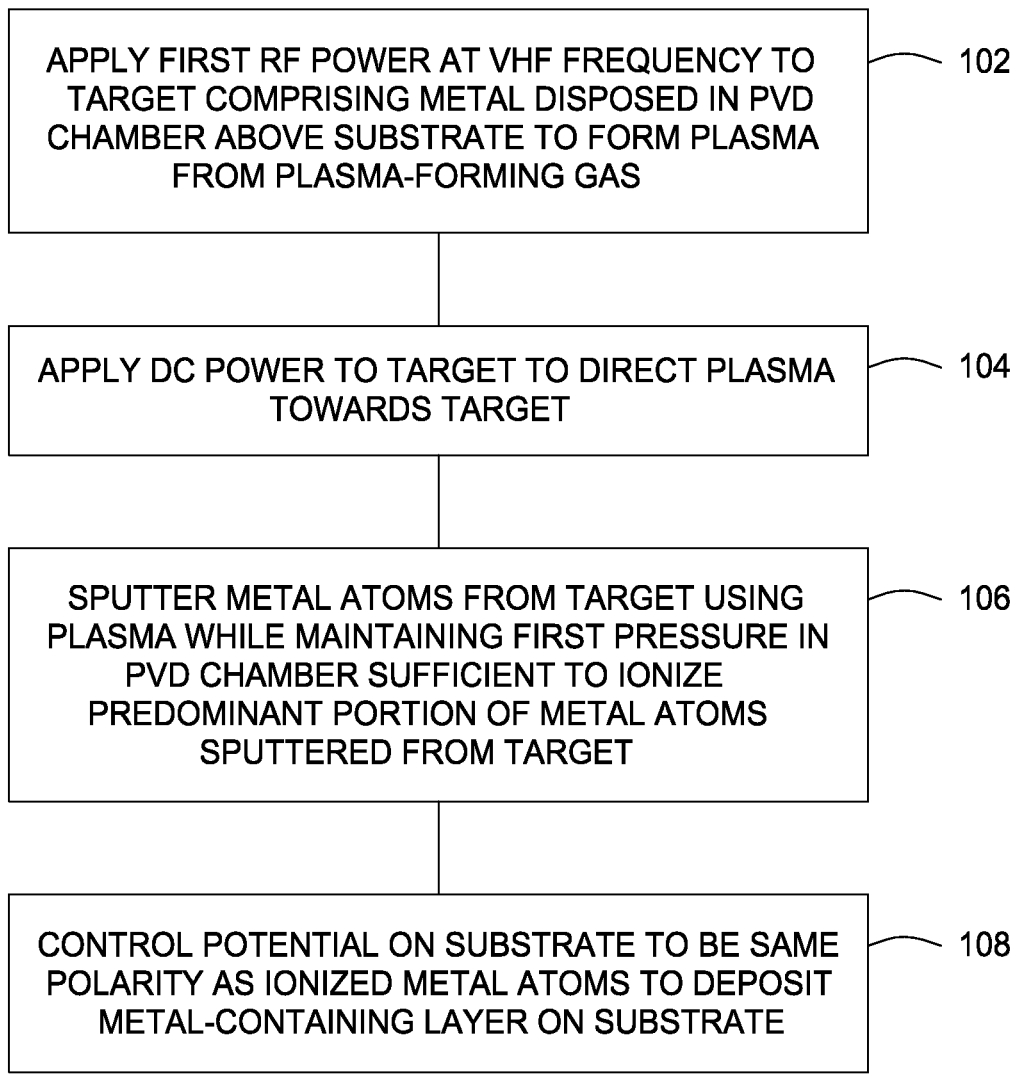
FIG. 1 depicts a flow chart for a method of depositing a metal-containing layer on a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

The inventors believe that the more porous, and therefore weaker, materials used for ULK dielectrics and the smaller line and space requirements associated with 28 nm and below feature sizes require better hardmask layer thickness uniformity and lower layer stress to improve critical dimension (CD) variation. In RF/DC PVD, layer stress can be reduced with high pressure. However, low stress layers deposited using high pressure process can be porous, having low film density. The low film density undesirably sacrifices etch selectivity during patterning etch processes.

In the present invention, RF/DC PVD is used to achieve high density layer deposition, such as a TiN layer, with a very large stress tuning ranges (about 2 GPa tensile stress to about −4 GPa compressive stress). In some embodiments, a positive potential may be produced on the substrate to reduce the kinetic energy of ionized metal atoms in a vertical direction, e.g., perpendicular to the substrate. With tunable ion energy, ion bombardment can be controlled. In some embodiments, exemplary film stress ranges of about 2 GPa tensile stress to about −4 GPa compressive stress can be achieved. Further, high kinetic energy in a horizontal direction, e.g., parallel to the substrate can promote orderly crystalline layer growth. For example, highly ordered (002) TiN growth having improved film density which can result in lower etch rates and improved etch selectivity has been achieved.

FIG. 1 depicts a flow chart of a method 100 for processing a substrate in accordance with some embodiments of the present invention. The method 100 is described below with respect to the stages of depositing a metal-containing layer as depicted in FIG. 2. The method 100 may be performed in any suitable PVD process chamber having both DC and radio frequency (RF) power sources, such as a process chamber 300 described below with respect to FIG. 3.

Figure 2A:
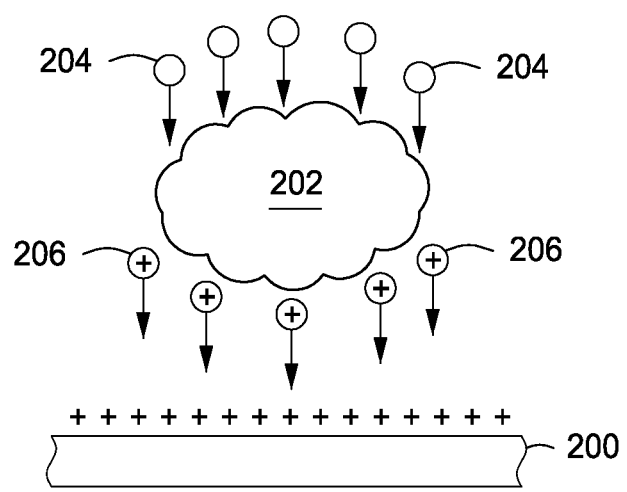
FIGS. 2A-B depict the stages of deposition in accordance with the method depicted in FIG. 1.

The method 100 begins by providing a substrate 200 as shown in FIG. 2A to a PVD chamber, for example the process chamber 300. The substrate may include a blank wafer, such as having no features disposed thereon. Alternatively, the substrate 200 may have features such as vias or trenches, or high aspect ratio features, for example, for through silicon via (TSV) applications or the like. A high aspect ratio feature as used herein may include those features having a height to width aspect ratio of at least about 5:1 (e.g., a high aspect ratio). In some embodiments, the substrate 200 may be comprised of one or more of silicon (Si), ($SiO_2$), (SiN), or other dielectric materials. In some embodiments, the substrate 200 may include an upper layer of a low k dielectric material, and in some embodiments, an ultra low k dielectric material. As used herein ultra low k dielectric materials include dielectric materials having a k value of less than or equal to 2.5.

At 102, RF power (such as from an RF power source 318, described below) is applied at a VHF frequency to a target comprising metal disposed above the substrate 200 to form a plasma 202 from a plasma-forming gas. The target may be the target 306 discussed below. Further, the target may comprise one or more of metals, metal alloys, or the like, suitable for forming a metal-containing layer on the substrate 200. For example, the target may comprise one or more of titanium (Ti), tantalum (Ta), copper (Cu), aluminum (Al), titanium nitride (TiN), aluminum nitride (AlN), aluminum oxide ($Al_2O_3$), silicon oxide ($SiO_2$), or silicon nitride (SiN), boron Nitride (BN), titanium oxide ($TiO_2$), tantalum oxide ($TaO_x$), hafnium oxide ($HfO_2$), or the like. The plasma-forming gas may include one or more inert gases, such as a noble gas, or other inert gases. For example, non-limiting examples of suitable plasma-forming gases may include argon (Ar), helium (He), xenon (Xe), neon (Ne), hydrogen ($H_2$), nitrogen ($N_2$), or the like.

The RF power may be applied at a VHF frequency for one or more of forming the plasma from the plasma-forming gas and ionizing metal atoms sputtered from the target by the plasma. As used herein, a VHF frequency is a frequency in the range of from about 27 MHz to about 100 MHz. In some embodiments, the VHF frequency applied is about 60 MHz. For example, increasing the VHF frequency may increase the plasma density and/or the amount of ionization in metal atoms sputtered from the target. The RF power applied to the target at 102 may be sufficient to sputter target material. However, optionally, at 104, DC power may also be applied to the target to increase the rate at which material can be sputtered from the target, as discussed below.

At 104, optionally, DC power may be applied to the target to direct the plasma 202 towards the target, for example, from a DC power source 320 coupled to the target 306 as described below. In some embodiments, the DC power may range from about 1 to about 2 kilowatts (kW). In some embodiments, the DC power may be about 1-5 kW, or approximately 2 kW. The DC power may be adjusted to control the deposition rate of sputtered metal atoms on the substrate. For example, increasing the DC power can result in increased interaction of the plasma with the target and increased sputtering of metal atoms from the target.

At 106, metal atoms 204 are sputtered from the target using the plasma while maintaining a first pressure in the PVD chamber sufficient to ionize a predominant portion of metal atoms being sputtered from the target. For example, a predominant portion of metal atoms may range from about 60 to about 90 percent of the total number of metal atoms being sputtered by the plasma. The first pressure, in addition to the first RF power and the DC power applied, may be dependent on process chamber geometry (such as substrate size, target to substrate distance, and the like). For example, the first pressure may range from about 6 to about 140 millitorr (mT) in a chamber configured with a target to substrate gap of about 60 to 90 millimeters (mm). In some embodiments, the first pressure is about 100 mTorr. The first pressure in the chamber may be maintained by the flow rate of the plasma-forming gas and/or the flow rate of an additional gas, such as an inert gas, which may be co-flowed with the plasma-forming gas. The first pressure may provide a high density of gas molecules between the target and the substrate 200 with which sputtered metal atoms 204 may collide and become ionized metal atoms 206. Pressure may be additionally utilized to control the amount of ionization of metal atoms sputtered from the target. For example, increasing pressure in the target to substrate gap may increase the number of collisions with metal atoms and increase the amount of ionized metal atoms 206.

Figure 2B:
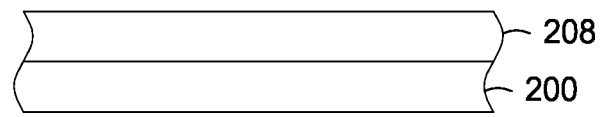

At 108, the potential on the substrate 200 may be controlled to be the same polarity as the ionized metal atoms 206 to deposit a metal-containing layer 208, as illustrated in FIG. 2B (illustrated as '+' symbols on the surface of the substrate 200 and on the ionized metal atoms 206 in FIG. 2A, although in some embodiments, the ionized metal atoms, and therefore the potential on the substrate, may alternatively be negative). For example, the potential on the surface of the substrate can be controlled by controlling a plasma sheath voltage between the substrate and the plasma 202. The plasma sheath voltage may be controlled by various methods, as discussed below.

Providing a like polarity on the substrate as present in the ionized metal atoms may advantageously reduce the ion energy of the ionized metal atoms 206 (or the velocity) in a direction perpendicular to the substrate 200, resulting in a lower stress of the layer. The ionized metal atoms, however, advantageously retain their high ion energy in the horizontal direction, which may promote crystalline ordering in the metal-containing layer 208, and thus may result in a layer having highly ordered crystalline structure and increased layer density.

In some embodiments, the plasma sheath voltage may be controlled by controlling the chamber impedance at the substrate. For example, the chamber impedance can be controlled by a capacitance tuner coupled between the substrate support and ground, such as the capacitance tuner 364 discussed below and illustrated in FIG. 3. In some embodiments, a capacitance tuner may be used to control the plasma sheath voltage to be in the range of about −500V to about 500V.

In some embodiments, the plasma sheath voltage may be controlled by applying a DC energy to the substrate. For example, DC energy may be provided to the substrate 200 by a DC power supply, such as a DC power supply 361 discussed below and illustrated in FIG. 3. In some embodiments, a DC power supply may be used to control the plasma sheath voltage to be in the range of about −500V to about 500V.

In some embodiments, the plasma sheath voltage may be controlled by applying RF energy to the substrate. For example, RF energy may be provided to the substrate 200 by one or more RF power supplies, such as a RF power supply 362 and/or 363 as discussed below and illustrated in FIG. 3. In some embodiments, an RF power supply may be used to control the plasma sheath voltage to be in the range of about −500V to about 500V.

Figure 3:
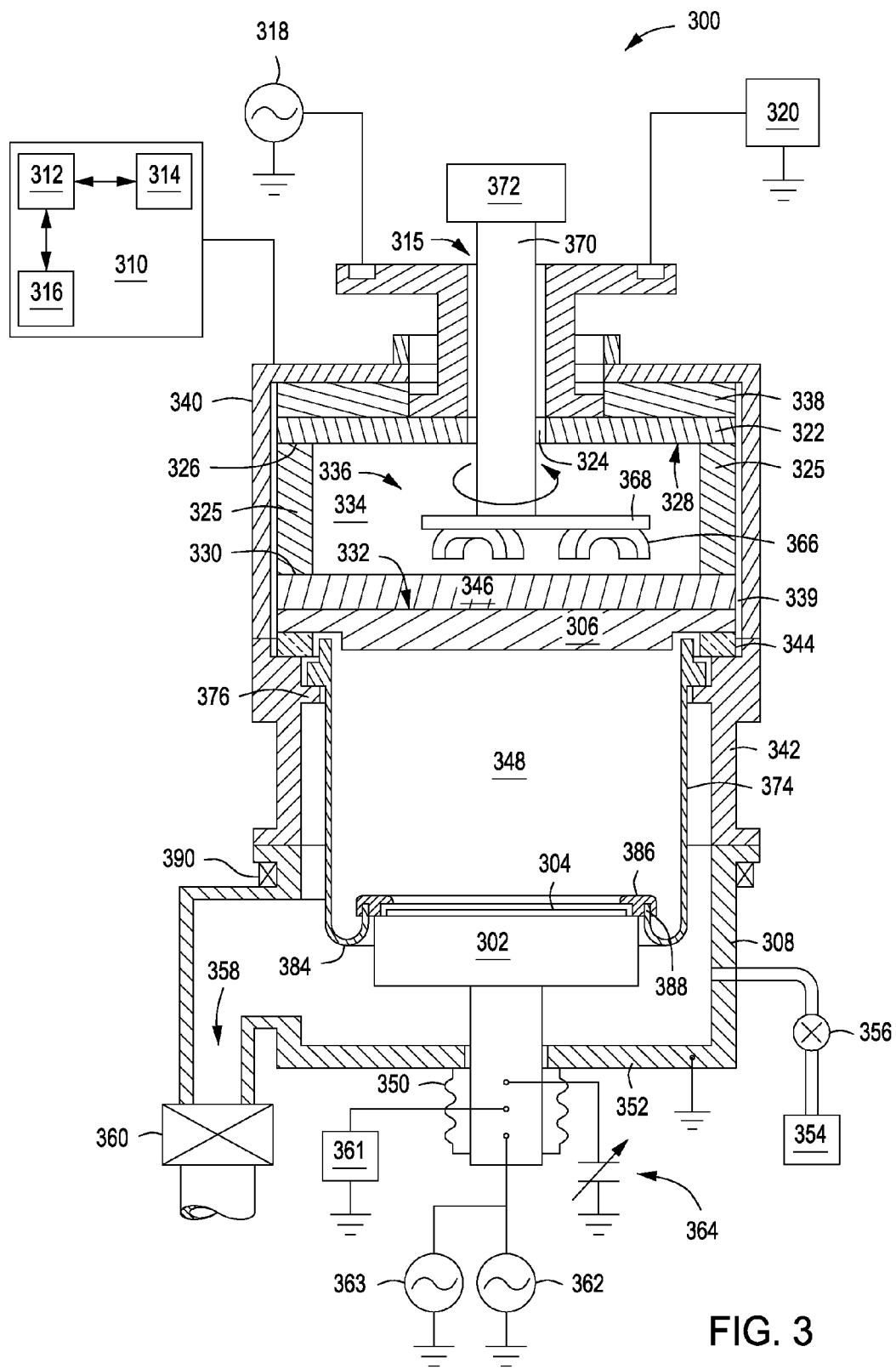
FIG. 3 depicts a schematic, cross-sectional view of a physical vapor deposition (PVD) chamber in accordance with some embodiments of the present invention.

FIG. 3 depicts a schematic, cross-sectional view of a physical vapor deposition chamber (process chamber 300) in accordance with some embodiments of the present invention. Examples of suitable PVD chambers are commercially available from Applied Materials, Inc., of Santa Clara, Calif. Other process chambers from other manufactures may also be used to practice the inventive methods disclosed herein.

The process chamber 300 contains a substrate support pedestal 302 for receiving a substrate 304 thereon, and a sputtering source, such as a target 306. The substrate support pedestal 302 may be located within a grounded enclosure wall 308, which may be a chamber wall (as shown) or a grounded shield (a ground shield 340 is shown covering at least some portions of the chamber 300 above the target 306. In some embodiments, the ground shield 340 could be extended below the target to enclose the pedestal 302 as well.).

In some embodiments, the process chamber includes a feed structure for coupling RF and DC energy to the target 306. The feed structure is an apparatus for coupling RF and DC energy to the target, or to an assembly containing the target, for example, as described herein. A first end of the feed structure can be coupled to an RF power source 318 and a DC power source 320, which can be respectively utilized to provide RF and DC energy to the target 306. For example, the DC power source 320 may be utilized to apply a negative voltage, or bias, to the target 306. In some embodiments, RF energy supplied by the RF power source 318 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 318 and the DC power source 320.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure. The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 322. The source distribution plate includes a hole 324 disposed through the source distribution plate 322 and aligned with a central opening of the feed structure. The source distribution plate 322 may be fabricated from suitable conductive materials to conduct the RF and DC energy from the feed structure.

The source distribution plate 322 may be coupled to the target 306 via a conductive member 325. The conductive member 125 may be a tubular member having a first end 326 coupled to a target-facing surface 328 of the source distribution plate 322 proximate the peripheral edge of the source distribution plate 322. The conductive member 325 further includes a second end 330 coupled to a source distribution plate-facing surface 332 of the target 306 (or to the backing plate 346 of the target 306) proximate the peripheral edge of the target 306.

A cavity 334 may be defined by the inner-facing walls of the conductive member 325, the target-facing surface 328 of the source distribution plate 322 and the source distribution plate-facing surface 332 of the target 306. The cavity 334 is fluidly coupled to the central opening 315 of the body via the hole 324 of the source distribution plate 322. The cavity 334 and the central opening 315 of the body may be utilized to at least partially house one or more portions of a rotatable magnetron assembly 336 as illustrated in FIG. 3 and described further below. In some embodiments, the cavity may be at least partially filled with a cooling fluid, such as water ($H_2O$) or the like.

A ground shield 340 may be provided to cover the outside surfaces of the lid of the process chamber 300. The ground shield 340 may be coupled to ground, for example, via the ground connection of the chamber body. The ground shield 340 has a central opening to allow the feed structure to pass through the ground shield 340 to be coupled to the source distribution plate 322. The ground shield 340 may comprise any suitable conductive material, such as aluminum, copper, or the like. An insulative gap 339 is provided between the ground shield 340 and the outer surfaces of the distribution plate 322, the conductive member 325, and the target 306 (and/or backing plate 346) to prevent the RF and DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 340 and may be an integral part of the ground shield 340 or a separate part coupled to the ground shield to provide grounding of the feed structure. The ground collar 340 may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents cross-talk between the RF feed (e.g., electrical feed 205, discussed below) and the body, thereby improving plasma, and processing, uniformity.

An isolator plate 338 may be disposed between the source distribution plate 322 and the ground shield 340 to prevent the RF and DC energy from being routed directly to ground. The isolator plate 338 has a central opening to allow the feed structure to pass through the isolator plate 338 and be coupled to the source distribution plate 322. The isolator plate 338 may comprise a suitable dielectric material, such as a ceramic, a plastic, or the like. Alternatively, an air gap may be provided in place of the isolator plate 338. In embodiments where an air gap is provided in place of the isolator plate, the ground shield 340 may be structurally sound enough to support any components resting upon the ground shield 340.

The target 306 may be supported on a grounded conductive aluminum adapter 342 through a dielectric isolator 344. The target 306 comprises a material to be deposited on the substrate 304 during sputtering, such a metal or metal oxide. In some embodiments, the backing plate 346 may be coupled to the source distribution plate-facing surface 332 of the target 306. The backing plate 346 may comprise a conductive material, such as copper-zinc, copper-chrome, or the same material as the target, such that RF and DC power can be coupled to the target 306 via the backing plate 346. Alternatively, the backing plate 346 may be non-conductive and may include conductive elements (not shown) such as electrical feedthroughs or the like for coupling the source distribution plate-facing surface 332 of the target 306 to the second end 330 of the conductive member 325. The backing plate 346 may be included for example, to improve structural stability of the target 306.

The substrate support pedestal 302 has a material-receiving surface facing the principal surface of the target 306 and supports the substrate 304 to be sputter coated in planar position opposite to the principal surface of the target 306. The substrate support pedestal 302 may support the substrate 304 in a central region 348 of the process chamber 300. The central region 348 is defined as the region above the substrate support pedestal 302 during processing (for example, between the target 306 and the substrate support pedestal 302 when in a processing position).

In some embodiments, the substrate support pedestal 302 may be vertically movable through a bellows 350 connected to a bottom chamber wall 352 to allow the substrate 304 to be transferred onto the substrate support pedestal 302 through a load lock valve (not shown) in the lower portion of processing the chamber 300 and thereafter raised to a deposition, or processing position. One or more processing gases may be supplied from a gas source 354 through a mass flow controller 356 into the lower part of the chamber 300. An exhaust port 358 may be provided and coupled to a pump (not shown) via a valve 360 for exhausting the interior of the process chamber 300 and facilitating maintaining a desired pressure inside the process chamber 300.

An RF bias power source 362 may be coupled to the substrate support pedestal 302 in order to induce a negative DC bias on the substrate 304. In addition, in some embodiments, a negative DC self-bias may form on the substrate 304 during processing. For example, RF power supplied by the RF bias power source 362 may range in frequency from about 2 MHz to about 60 MHz, for example, non-limiting frequencies such as 2 MHz, 13.56 MHz, or 60 MHz can be used. Further, a second RF bias power source 363 may be coupled to the substrate support pedestal 302 and provide any of the frequencies discussed above for use with the RF bias power source 362. In other applications, the substrate support pedestal 302 may be grounded or left electrically floating. For example, a capacitance tuner 364 may be coupled to the substrate support pedestal for adjusting voltage on the substrate 304 for applications where RF bias power may not be desired. In some embodiments, a DC power supply 361 may be coupled to the pedestal 302 for adjusting voltage on the substrate 304 for applications where RF bias power and/or other methods of adjusting voltage on the substrate 304 are not desired.

A rotatable magnetron assembly 336 may be positioned proximate a back surface (e.g., source distribution plate-facing surface 332) of the target 306. The rotatable magnetron assembly 336 includes a plurality of magnets 366 supported by a base plate 368. The base plate 368 connects to a rotation shaft 370 coincident with the central axis of the chamber 300 and the substrate 304 as illustrated in FIG. 3. However, this design of the magnetron assembly is merely one exemplary embodiment. For example, other designs may include a rotatable magnetron assembly that is disposed off axis with respect to the central axis of the chamber and the substrate. One example of a suitable process chamber that may be used to practice methods in accordance with the teachings described herein is described in U.S. patent application Ser. No. 13/075,841, filed Mar. 30, 2011 by Ritchie, et al., and entitled "PHYSICAL VAPOR DEPOSITION CHAMBER WITH ROTATING MAGNET ASSEMBLY AND CENTRALLY FED RF POWER," which is hereby incorporated by reference in its entirety.

A motor 372 can be coupled to the upper end of the rotation shaft 370 to drive rotation of the magnetron assembly 336. The magnets 366 produce a magnetic field within the chamber 300, generally parallel and close to the surface of the target 306 to trap electrons and increase the local plasma density, which in turn increases the sputtering rate. The magnets 366 produce an electromagnetic field around the top of the chamber 300, and magnets 366 are rotated to rotate the electromagnetic field which influences the plasma density of the process to more uniformly sputter the target 306. For example, the rotation shaft 370 may make about 0 to about 150 rotations per minute.

In some embodiments, the chamber 300 may further include a process kit shield 374 connected to a ledge 376 of the adapter 342. The adapter 342 in turn is sealed and grounded to the aluminum chamber sidewall 308. Generally, the process kit shield 374 extends downwardly along the walls of the adapter 342 and the chamber wall 308 downwardly to below an upper surface of the substrate support pedestal 302 and returns upwardly until reaching an upper surface of the substrate support pedestal 302 (e.g., forming a u-shaped portion 384 at the bottom). Alternatively, the bottommost portion of the process kit shield need not be a u-shaped portion 384 and may have any suitable shape. A cover ring 386 rests on the top of an upwardly extending lip 388 of the process kit shield 374 when the substrate support pedestal 302 is in its lower, loading position but rests on the outer periphery of the substrate support pedestal 302 when it is in its upper, deposition position to protect the substrate support pedestal 302 from sputter deposition. An additional deposition ring (not shown) may be used to shield the periphery of the substrate 304 from deposition. Embodiments of a process kit shield are discussed below in accordance with the present invention.

In some embodiments, a magnet 390 may be disposed about the chamber 200 for selectively providing a magnetic field between the substrate support pedestal 302 and the target 306. For example, as shown in FIG. 3, the magnet 390 may be disposed about the outside of the chamber wall 308 in a region just above the substrate support pedestal 302 when in processing position. In some embodiments, the magnet 390 may be disposed additionally or alternatively in other locations, such as adjacent the adapter 342. The magnet 390 may be an electromagnet and may be coupled to a power source (not shown) for controlling the magnitude of the magnetic field generated by the electromagnet.

A controller 310 may be provided and coupled to various components of the process chamber 300 to control the operation thereof. The controller 310 includes a central processing unit (CPU) 312, a memory 314, and support circuits 316. The controller 310 may control the process chamber 300 directly, or via computers (or controllers) associated with particular process chamber and/or support system components. The controller 310 may be one of any form of general-purpose computer processor that can be used in an industrial setting for controlling various chambers and sub-processors. The memory, or computer readable medium, 434 of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and subsystems, and the like. Inventive methods as described herein may be stored in the memory 314 as software routine that may be executed or invoked to control the operation of the process chamber 300 in the manner described herein. The software routine may also be stored and/or executed by a second CPU (not shown) that is remotely located from the hardware being controlled by the CPU 312.

While the foregoing is directed to embodiments of the present invention, other and further embodiments of the invention may be devised without departing from the basic scope thereof.

The invention claimed is:

1. A method of depositing a metal-containing layer on a wafer in a physical vapor deposition (PVD) chamber, comprising:

applying RF power at a VHF frequency between 27 MHz and 100 MHz to a target comprising a metal disposed in the PVD chamber above the wafer to form a plasma from a plasma-forming gas;

sputtering metal atoms from the target using the plasma while maintaining a first pressure in the PVD chamber sufficient to ionize a predominant portion of the sputtered metal atoms to form ionized metal atoms; and controlling a potential on the wafer to be the same polarity as that of the ionized metal atoms to deposit a metal-containing layer on the wafer, wherein controlling the potential on the wafer to be the same polarity as that of the ionized metal atoms to deposit a metal-containing layer on the wafer further comprises reducing an ion energy of the ionized metal atoms in a direction perpendicular to the wafer to deposit the metal-containing layer with a desired film stress.

2. The method of claim 1, further comprising:
applying DC power to the target.

3. The method of claim 1, wherein the wafer comprises an ultra low-k dielectric material,
low-k dielectric material.

4. The method of claim 1, wherein the metal-containing layer comprises at least one of titanium (Ti), titanium nitride (TiN), aluminum nitride (AlN), aluminum oxide ($Al_2O_3$), silicon oxide ($SiO_2$), or silicon nitride (SiN).

5. The method of claim 1, wherein controlling the potential on the wafer further comprises:
controlling a plasma sheath voltage between the wafer and the plasma.

6. The method of claim 5, wherein controlling the plasma sheath voltage further comprises:
controlling impedance at the wafer using a capacitance tuner coupled between a substrate support and ground.

7. The method of claim 5, wherein controlling the plasma sheath voltage further comprises:
applying DC energy to the wafer.

8. The method of claim 5, wherein controlling the plasma sheath voltage further comprises:
applying RF energy to the wafer.

9. The method of claim 1, wherein controlling the potential on the wafer further comprises controlling an ion energy of the ionized metal atoms to deposit the metal-containing layer with a desired film stress.

10. The method of claim 9, wherein the film stress is about 2 GPa tensile stress to about −4 GPa compressive stress.

* * * * *